United States Patent
Reading

(10) Patent No.: US 9,695,586 B1
(45) Date of Patent: Jul. 4, 2017

(54) SELF-ERECTING SHAPES

(71) Applicant: National Technology & Engineering Solutions of Sandia, LLC, Albuquerque, NM (US)

(72) Inventor: Matthew W. Reading, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/156,132

(22) Filed: May 16, 2016

Related U.S. Application Data

(60) Provisional application No. 62/163,187, filed on May 18, 2015.

(51) Int. Cl.
*E04H 15/40* (2006.01)
*E04B 1/343* (2006.01)
*H01Q 15/00* (2006.01)
*H01L 31/048* (2014.01)
*B64G 1/44* (2006.01)

(52) U.S. Cl.
CPC .......... *E04B 1/34357* (2013.01); *B64G 1/443* (2013.01); *H01L 31/0481* (2013.01); *H01Q 15/00* (2013.01)

(58) Field of Classification Search
CPC ....... E04H 15/40; E04H 15/44; E04H 15/425; E04H 12/18; E04C 3/005
See application file for complete search history.

(56) References Cited

U.S. PATENT DOCUMENTS

| | | | | |
|---|---|---|---|---|
| 3,277,479 A | * | 10/1966 | Struble, Jr. | ............ H01Q 1/288 244/1 R |
| 3,675,667 A | | 7/1972 | Miller | |
| 4,044,358 A | | 8/1977 | Manning et al. | |
| 5,396,917 A | * | 3/1995 | Hazinski | ................. E04H 15/40 135/125 |
| 6,156,842 A | | 12/2000 | Hoenig et al. | |
| 6,267,129 B1 | * | 7/2001 | Zheng | ..................... E04H 15/40 135/126 |

(Continued)

OTHER PUBLICATIONS

"Pop Up Ball", Whitney Woods, Retrieved at: <<http://www.whitneywoods.co.uk/products/pop-up-ball/>>, Retrieved Date: Apr. 18, 2016, pp. 1-11.

*Primary Examiner* — Rodney Mintz
*Assistant Examiner* — Daniel Kenny
(74) *Attorney, Agent, or Firm* — Medley Behrens & Lewis LLC

(57) ABSTRACT

Technologies for making self-erecting structures are described herein. An exemplary self-erecting structure comprises a plurality of shape-memory members that connect two or more hub components. When forces are applied to the self-erecting structure, the shape-memory members can deform, and when the forces are removed the shape-memory members can return to their original pre-deformation shape, allowing the self-erecting structure to return to its own original shape under its own power. A shape of the self-erecting structure depends on a spatial orientation of the hub components, and a relative orientation of the shape-memory members, which in turn depends on an orientation of joining of the shape-memory members with the hub components.

20 Claims, 5 Drawing Sheets

(56) References Cited

U.S. PATENT DOCUMENTS

| | | | |
|---|---|---|---|
| 6,374,565 B1* | 4/2002 | Warren | B64G 1/222 |
| | | | 138/119 |
| 8,061,660 B2* | 11/2011 | Beidleman | B64G 1/222 |
| | | | 136/245 |
| 8,146,357 B2 | 4/2012 | Jung et al. | |
| 8,201,773 B1 | 6/2012 | Durham et al. | |
| 8,387,643 B2 | 3/2013 | Van Aalst | |
| 8,813,455 B2* | 8/2014 | Merrifield | E04C 3/02 |
| | | | 135/144 |

* cited by examiner

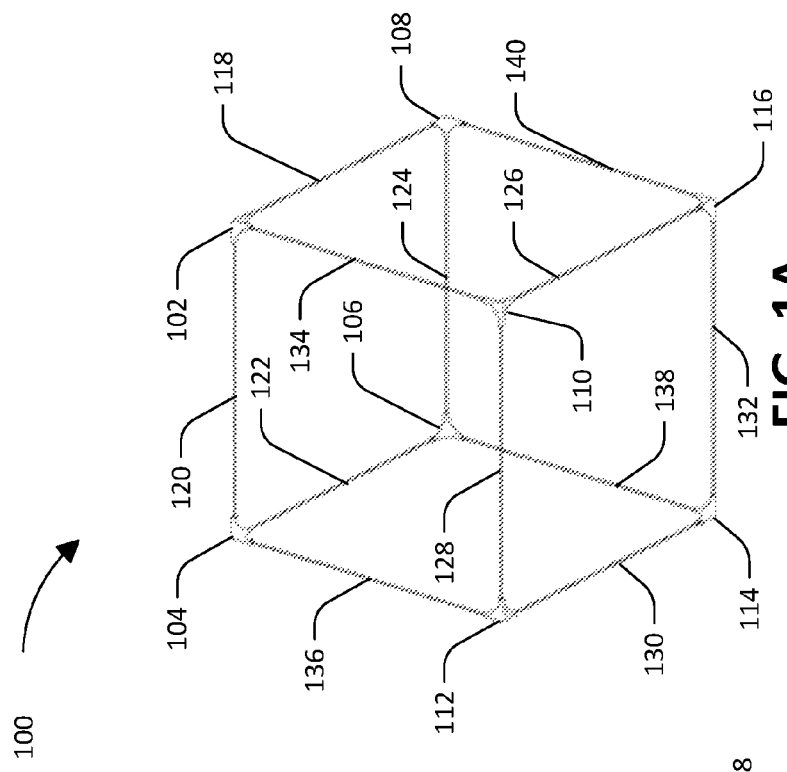
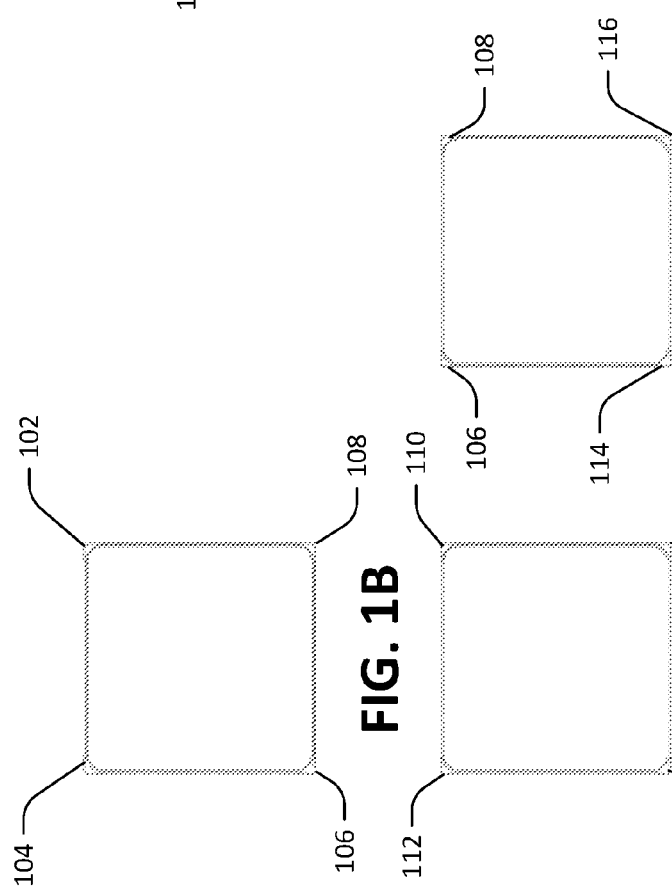

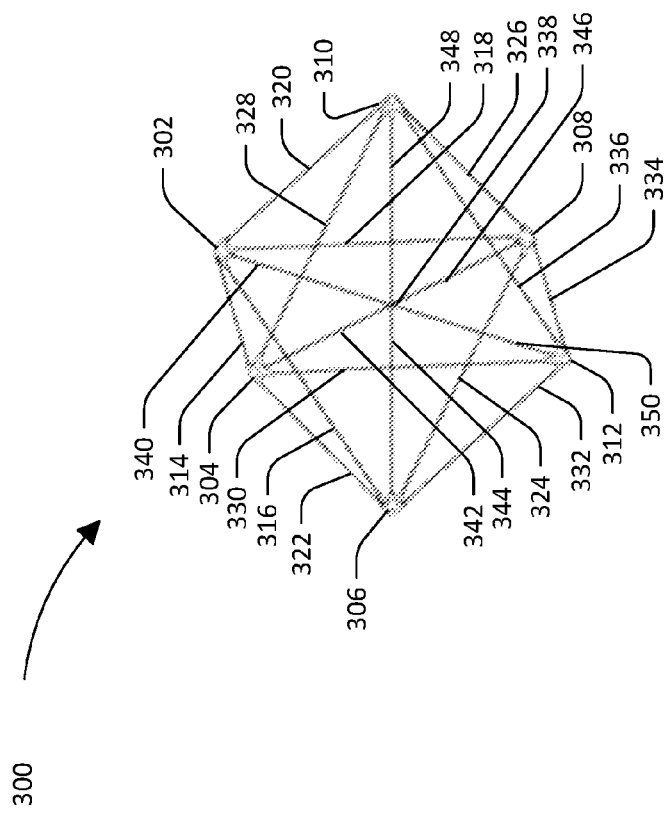
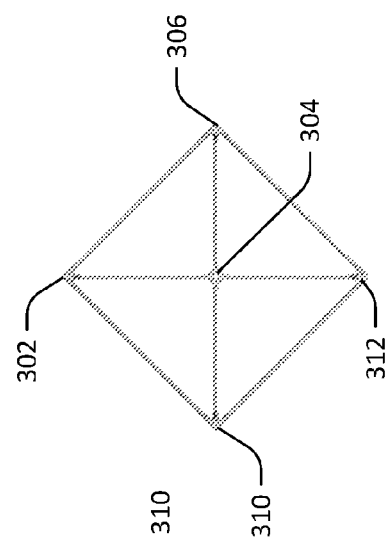
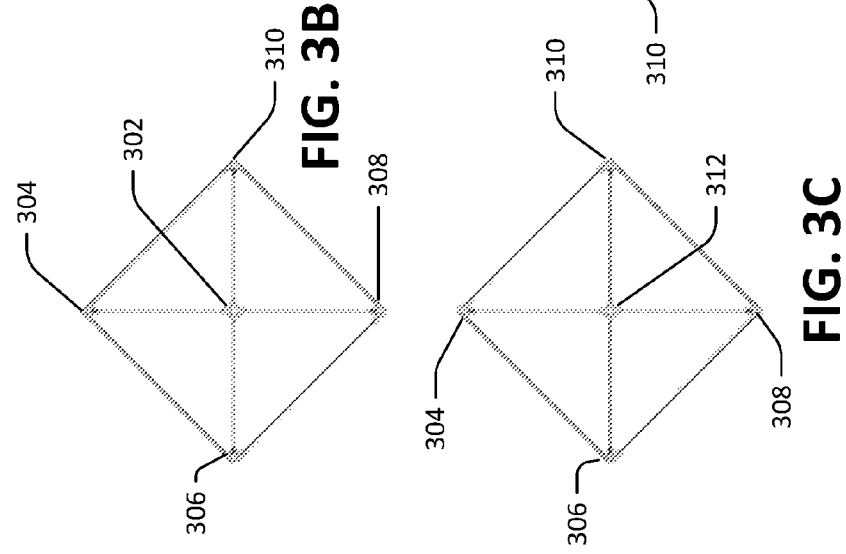

SELF-ERECTING SHAPES

RELATED APPLICATION

This application claims priority to U.S. Provisional Patent Application No. 62/163,187, filed May 18, 2015, and entitled "SELF-ERECTING SHAPES", the entirety of which is incorporated herein by reference.

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

Certain materials, called shape-memory materials, exhibit the property of being able to return to an original, pre-deformed shape after undergoing some strain or deformation responsive to heating above a transition temperature. Above the transition temperature, shape-memory materials exhibit the property of superelasticity, allowing them to return to their original shape after a force causing deformation is removed. In this way, shape-memory materials are said to "remember" their original shape.

SUMMARY

The following is a brief summary of subject matter that is described in greater detail herein. This summary is not intended to be limiting as to the scope of the claims.

Various technologies pertaining to self-erecting structures are described herein. Self-erecting structures share the property of being able to return to a particular shape on their own when they are not constrained by an external force. In an example, a self-erecting structure can comprise a plurality of hubs and a plurality of shape-memory members joining the plurality of hubs. The self-erecting structure has a shape that is defined by the arrangement of the hubs and the members that connect the hubs. In one example, the self-erecting structure can take the shape of a cube when each of eight vertex hubs are joined to three other vertex hubs in the eight vertex hubs by corresponding shape-memory members positioned at 90-degree angles to one another. In another example, a self-erecting structure can take the shape of an icosahedron. In still another example, a self-erecting structure can take the shape of an octahedral corner reflector.

When an external force is applied to the self-erecting structure, the shape-memory members of the structure can deform from their original shape to a deformed shape, and the self-erecting structure can be constrained to occupy a smaller or different shape than its deployed shape. When the constraining force is subsequently removed, the shape-memory members return to their original shape, thereby causing the self-erecting structure to return to its deployed shape. Flexible materials can also be attached to the shape-memory members of the self-erecting structure to form faces of the structure that can deform as the shape-memory members of the self-erecting structure deform.

Self-erecting structures can take on different properties based upon properties of the shape-memory material of which the shape-memory members are composed. For example, a self-erecting structure can be designed to be superelastic in a typical operating environment of the structure by selecting a shape-memory material having a transition temperature that is below a standard ambient temperature in the operating environment. In another example, a self-erecting structure can be designed only to self-erect responsive to heating by selecting a shape-memory material that has a transition temperature above the standard ambient temperature in the operating environment.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

FIGS. 1A-1D illustrate views of an exemplary self-erecting cube

FIGS. 3A-3D illustrate views of an exemplary self-erecting octahedron.

DETAILED DESCRIPTION

Figure 2A:
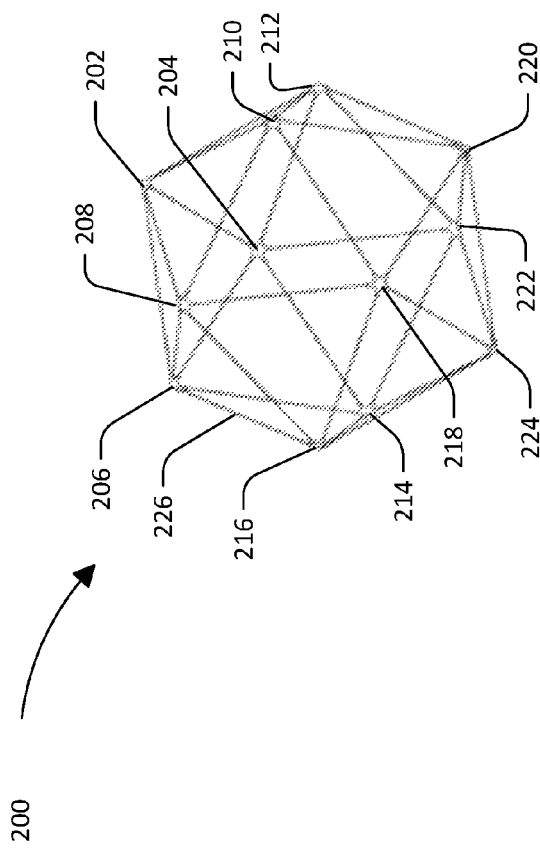
FIGS. 2A-2D illustrate views of an exemplary self-erecting icosahedron structure.

Various technologies pertaining to self-erecting shapes and other structures are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Additionally, as used herein, the term "exemplary" is intended to mean serving as an illustration or example of something, and is not intended to indicate a preference.

Shape-memory materials such as, for example, shape-memory alloys (e.g., nickel-titanium) and shape-memory polymers, exhibit the ability to undergo deformation responsive to application of a force, and return to an original pre-deformation shape responsive to heating above a transition temperature that is intrinsic to the material. The transition temperature of a material is a property that can be determined in part by the manufacturing process of the material. Above the transition temperature, shape-memory materials also exhibit the property of superelasticity. Thus, when a force is applied to the shape-memory material to deform it, and the force is subsequently removed, the shape-memory material returns to its original pre-deformation shape without requiring another external force to reshape it. The present application is directed toward constructing structures using shape-memory materials so that a structure is self-erecting when a constraining force is removed.

The self-erecting structures described herein are constructed by joining hub components, or fittings, that have some coupling mechanism with shape-memory members that are composed of shape-memory alloys or shape-memory polymers, wherein the spatial location of the hub components and the spatial orientation of the shape-memory members that join them defines a shape of the structure. As described in greater detail below with reference to certain exemplary shapes, the hub components of the self-erecting structure are generally positioned at vertices of a desired shape of the structure. Accordingly, hub components are hereinafter referred to as vertex hubs. It is to be understood, however, that a vertex hub, as the term is used herein, is not intended to be limited to a hub placed at a vertex of a shape. The shape-memory members that join the vertex hubs form edges of the desired shape. The orientation of the shape-memory members depends upon the position of the coupling mechanisms of the vertex hubs, and thus the position of the mechanisms on the vertex hubs partly determines the shape of the structure.

With reference to FIG. 1A, a perspective view of an exemplary self-erecting cube 100 is illustrated. The self-erecting cube 100 includes a plurality of vertex hubs 102-116 and a plurality of shape-memory members 118-140. The spatial arrangement of the vertex hubs 102-116, and the relative orientation of the shape-memory members 118-140 defines the shape of the self-erecting cube 100. For any given shape, one vertex hub can be placed at each of the shape's vertices, and shape-memory members can be used to connect the vertex hubs along the shape's edges. In the self-erecting cube 100, each of the shape-memory members 118-140 connects two of the vertex hubs 102-116. Each of the vertex hubs 102-116 is connected to two other vertex hubs by two respective shape-memory members.

A top face of the cube 100 is formed by vertex hubs 102-108 connected by members 118-124. Vertex hub 102 is connected to vertex hub 104 by member 120. Vertex hub 104, in turn, is connected to vertex hub 106 by the member 122. Vertex hub 106 is further connected to vertex hub 108 by the member 124, and vertex hub 108 is connected to the vertex hub 102 by the member 118, forming a square face of the cube 100. The vertex hubs 102-108 are also connected to the vertex hubs 110-116, respectively, by respective members 134-140, which extend in a perpendicular direction from the square face formed by the hubs 102-108 and the members 118-124. The vertex hubs 110-116 are further connected to one another by members 126-132: hub 110 connected to hub 112 by member 128, hub 112 in turn connected to hub 114 by member 130, hub 114 further connected to hub 116 by member 132, and hub 116 still further connected to hub 110 by member 126 in order to form a bottom face of the cube 100.

In one exemplary embodiment, the vertex hubs 102-116 can be rigid plastic joints, and the coupling mechanisms of the vertex hubs 102-116 can be fitting openings that receive the shape-memory members 118-140. In an example, the members 118-140 can be secured in the fitting openings of the vertex hubs 102-116 by friction fitting, wherein friction between an interior surface of a fitting opening and a surface of the member holds the member inside the fitting opening. In another example, the members 118-140 can be secured in the fitting openings with an adhesive or other coupling mechanism. A size and shape of the fitting openings can be dependent upon a size and shape of the shape-memory members 118-140 so that ends of the shape-memory members 118-140 fit into the fitting openings. By way of example, the shape-memory members can be round wires having a diameter between 0.002 and 0.125 inches. In another example, the shape-memory members can be strips having an exemplary thickness of between 0.003 and 0.040 inches and a width of between 0.017 and 0.200 inches. In this example, the shape-memory strips do not deform in a direction coplanar with the thickness of the strips, and a direction of deformation of the self-erecting structure can be determined by selecting an orientation of the shape-memory members. In still another example, the shape-memory members can be tubes having a diameter of between, for example, 0.007 inches and 0.394 inches. A size and shape of the shape-memory members of a self-erecting structure can depend on desirable structural characteristics of the self-erecting structure (e.g., strength, weight, etc.). It is to be understood that the vertex hubs of a self-erecting structure need not have fitting openings for receiving the shape-memory members. Vertex hubs of a self-erecting structure could instead use crimps, clamps, or any other coupling mechanism to hold the shape-memory members in place, provided that the vertex hubs can hold ends of shape-memory members at a fixed orientation relative to one another (e.g., 90° in the exemplary self-erecting cube 100).

Referring now to FIG. 1B, a top view of the self-erecting cube 100 is illustrated showing vertex hubs 102-108. FIG. 1C illustrates a bottom view of the cube 100, and shows vertex hubs 110-116. FIG. 1D shows a side view of the cube 100, including vertex hubs 106-108 and 114-116.

Referring now to FIG. 2, an exemplary self-erecting icosahedron 200 is illustrated. The icosahedron 200 includes vertex hubs 202-224 and a plurality of shape-memory members (e.g., member 226), each of the members connecting two of the vertex hubs 202-224. The icosahedron 200 has 20 triangular faces, each face defined by three vertex hubs and the members that connect them. A face of the icosahedron 200 can be open, or the face can comprise a flexible material attached to each of the members that define edges of the face. Each of the vertex hubs 202-224 of the icosahedron 200 is connected to five other vertex hubs by a shape-memory member. The top vertex hub 202 is connected to each of vertex hubs 204-212 by a respective shape-memory member. The vertex hubs 204-212 lie in a same first plane, and are positioned at five vertices of a first regular pentagon in the first plane. In addition to being connected to the top vertex hub 202, each of the vertex hubs 204-212 is connected to two adjacent vertex hubs in the regular pentagon. Vertex hub 204 is connected to hubs 206 and 212, vertex hub 206 is further connected to hub 208, which hub 208 is further connected to hub 210, which hub 210 is still further connected to hub 212. Five of the 20 triangular faces of the icosahedron 200 are defined by these hubs and their connecting members: a first face with vertices at hubs 202, 204, and 206; a second face with vertices at hubs 202, 206, and 208; a third face with vertices at hubs 202, 208, and 210; a fourth face with vertices at hubs 202, 210, and 212; and a fifth face with vertices at hubs 202, 204, and 212.

The vertex hubs 204-212 are each further connected to two of five hubs 214-222 that lie in a same second plane and that are positioned at five vertices of a second regular pentagon. The hub 204 is connected to hubs 214 and 222; the hub 206 is connected to hubs 214 and 216; the hub 208 is connected to hubs 216 and 218; the hub 210 is connected to hubs 218 and 220; and hub 212 is connected to hubs 220 and

222. These hubs and their connecting members define an additional ten of the triangular faces of the icosahedron 200: a sixth face with vertices at hubs 204, 214, and 222; a seventh face with vertices at hubs 204, 206, and 214; an eighth face with vertices at hubs 206, 214, and 216; a ninth face with vertices at hubs 206, 208, and 216; a tenth face with vertices at hubs 208, 216, and 218; an eleventh face with vertices at hubs 208, 210, and 218; a twelfth face with vertices at hubs 210, 218, and 220; a thirteenth face with vertices at hubs 210, 212, and 220; a fourteenth face with vertices at 212, 220, and 222; and a fifteenth face with vertices at 204, 212, and 222.

The vertex hubs 214-222 are each finally connected to the bottom vertex hub 224. These connections form the final five triangular faces of the icosahedron 200: a sixteenth face with vertices at hubs 214, 216, and 224; a seventeenth face with vertices at hubs 216, 218, and 224; an eighteenth face with vertices at hubs 218, 220, and 224; a nineteenth face with vertices at hubs 220, 222, and 224; and a twentieth face with vertices at hubs 214, 222, and 224.

Figure 2B:
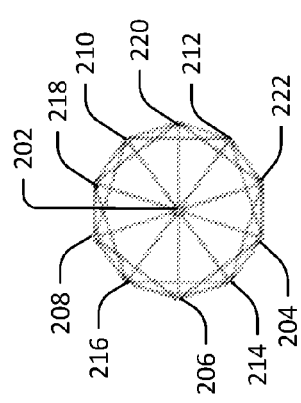
Figure 2D:
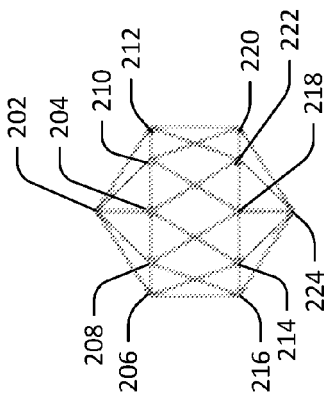
Figure 2C:
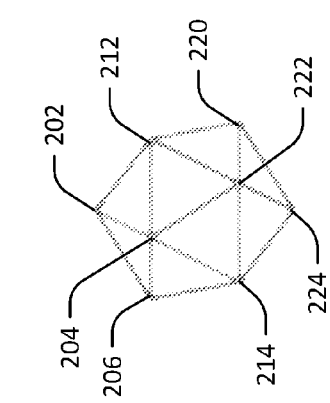

Referring now to FIG. 2B, a top view of the icosahedron 200 is shown. The top view shows top vertex hub 202 at the center, with vertex hubs 204-222 arranged around and below it. FIG. 2C presents a side view of the icosahedron 200, at an orientation wherein only the vertex hubs 202-206, 212-14, and 220-224 are visible. Referring now to FIG. 2D, another side view of the icosahedron 200 is shown, but unlike FIG. 2C, the icosahedron 200 is depicted at an orientation at which all of the vertex hubs 202-224 are visible.

Referring now to FIG. 3A, an exemplary self-erecting octahedron 300 is illustrated. The octahedron 300 comprises vertex hubs 302-312 and shape-memory members 314-336. The octahedron 300 shown in FIG. 3A can also include an optional vertex hub 338 (not pictured) and shape-memory members 340-350 that can be included in an exemplary embodiment in which the octahedron 300 is used as a corner reflector, as described in greater detail below.

The vertex hub 302 forms a top vertex of the octahedron 300, and is connected to vertex hubs 304-310 by members 314-320, respectively. The vertex hubs 304-310 lie in a same plane, and are joined together to form a square by coplanar members 322-328. The vertex hub 304 is joined to vertex hub 306 by member 322, hub 306 is joined to hub 308 by member 324, hub 308 is joined to hub 310 by member 326, and hub 310 is joined to hub 304 by member 328. The vertex hubs 304-310 are further joined to the vertex hub 312 by the members 330-336, respectively. In some embodiments, the octahedron 300 optionally includes a center vertex hub 338 and shape-memory members 340-350. The center vertex hub 338 and the members 340-350 can be used to improve the strength of the structure 300, or can support various materials that can be used to provide faces of the octahedron 300, as described in greater detail below. The center vertex hub 338 is joined to the vertex hubs 302-312 by members 340-350, respectively.

FIGS. 3B-3D illustrate views of the octahedron 300. FIG. 3B illustrates a top view of the octahedron 300, wherein the vertex hub 302 serves as the top vertex of the octahedron, and the vertex hubs 304-310 lie in a same plane below the top hub 302. FIG. 3C illustrates a bottom view of the octahedron 300. The vertex hub 312 is the bottom vertex of the octahedron 300, while the vertex hubs 304-310 lie in the same plane that is below the top hub 302 as shown in FIG. 3B and above the bottom hub as shown in FIG. 3C. FIG. 3D illustrates a side view of the octahedron 300. In the side view, the vertex hub 304 is nearest the viewer's position. Also in view are the top vertex hub 302, the bottom vertex hub 312, and vertex hubs 306 and 310.

In embodiments of any shape, various flexible materials can be attached to the shape-memory members that connect the vertex hubs such that the flexible material forms a face of a self-erecting shape or structure. When a force is applied to the structure, causing the members to deform, the flexible materials that form faces of the structure also deform, and so do not interfere with the self-erecting property of the structure.

For example, referring to the octahedron 300 depicted in FIGS. 3A-3D, flexible conductive weaves can be attached to the members 314-336 and 340-350 in order to form a corner reflector that can reflect electromagnetic waves back to their source. A first flexible weave can be attached to the members 324 and 344-346, a second flexible weave can be attached to the members 316, 340, and 344, and a third flexible weave can be attached to the members 318, 340, and 346. When the octahedron 300 is in its fully deployed state, the first flexible conductive weave forms a first triangular face with the members 324 and 344-346 as its sides and vertex hubs 306, 308, and 338 as its vertices; the second flexible conductive weave forms a second triangular face with members 316, 340, and 344 as its sides and vertex hubs 302, 306, and 338 as its vertices; and the third flexible conductive weave forms a third triangular face with members 318, 340, and 346 as its sides and vertex hubs 302, 308, and 338 as its vertices. Together, these three faces, plus an open face with members 316-318 and 324 as its sides, form a tetrahedron that has vertices 302, 306-308, and 338, with the open face presented at the exterior of the octahedron 300. The tetrahedron, with its conductive interior triangular faces formed by the conductive weaves, can serve as a corner reflector.

It is to be appreciated that seven more such corner reflectors can be formed by similar attachment of conductive materials to various members of the octahedron, one corner reflector for each external face of the octahedron (each external face of the octahedron corresponding to an open face of one of the corner reflectors). Accordingly, the self-erecting octahedron can be used as a radar corner reflector for emergency maritime use. Such self-erecting octahedral corner reflector has the advantage of being able to be deformed for storage in small spaces aboard a vessel, while also being able to deploy to the necessary shape on its own in emergencies. The self-erecting octahedral corner reflector can be deformed to occupy a smaller volume than its deployed shape, can be constrained in some fashion to prevent its deployment, and then can be stored in a storage space prior to use. When a user wishes to deploy the corner reflector, she can simply remove the constraint, and the corner reflector will deploy on its own by virtue of the superelasticity of its shape-memory members. Self-erecting structures can be constrained from deployment in many different ways, for example by placing the deformed self-erecting structure in a container, or tying it with ropes or strings.

Other exemplary features and applications of the present application are set forth below that are applicable to self-erecting structures described herein, regardless of their shape. In some embodiments, a transition temperature of the shape-memory members used to construct a self-erecting structure is chosen based upon a desirable operational environment for the self-erecting structure. By way of example, the shape-memory members of a self-erecting structure can have a transition temperature that is above a standard ambient temperature of an operational environment of the structure. The standard ambient temperature can be, for example, room temperature (e.g., 70° F.). In the example, when the self-erecting structure is deformed at room temperature it will not return to its original shape. The self-erecting structure can be deformed to occupy a smaller volume, allowing for easier storage. The self-erecting structure can subsequently be heated to a temperature above the transition temperature of the shape-memory members, whereupon the self-erecting structure will return to its original pre-deformation shape.

In other embodiments, the transition temperature can be selected to be below the standard ambient temperature of the operational environment, so that the structure exhibits superelasticity under standard operating conditions in the operational environment. The standard ambient temperature of the operational environment can vary across a range of temperatures. For example, a vessel at sea, depending on where it operates, may experience ambient temperatures between −10° F. and 90° F. In an example where the structure is a self-deploying radar corner reflector, the transition temperature of the shape-memory members can be selected to be below such range at, for example, −50° F.

In another example, the shape-memory members of the self-erecting structure can have a transition temperature based upon a desirable deployment condition for the structure. For example, a spacecraft, satellite, or other probe can comprise a self-erecting solar array that comprises shape-memory members and vertex hubs according to the present application. The shape-memory members of the self-erecting array can have a transition temperature based upon an expected steady-state temperature of the array when sunlight is incident upon it. The transition temperature can be, for example, 10-100° F. below the expected steady-state temperature of the array when it is in direct sunlight, thereby causing the self-erecting solar array to deploy when sunlight hits the array and begins to heat it.

Figure 4:
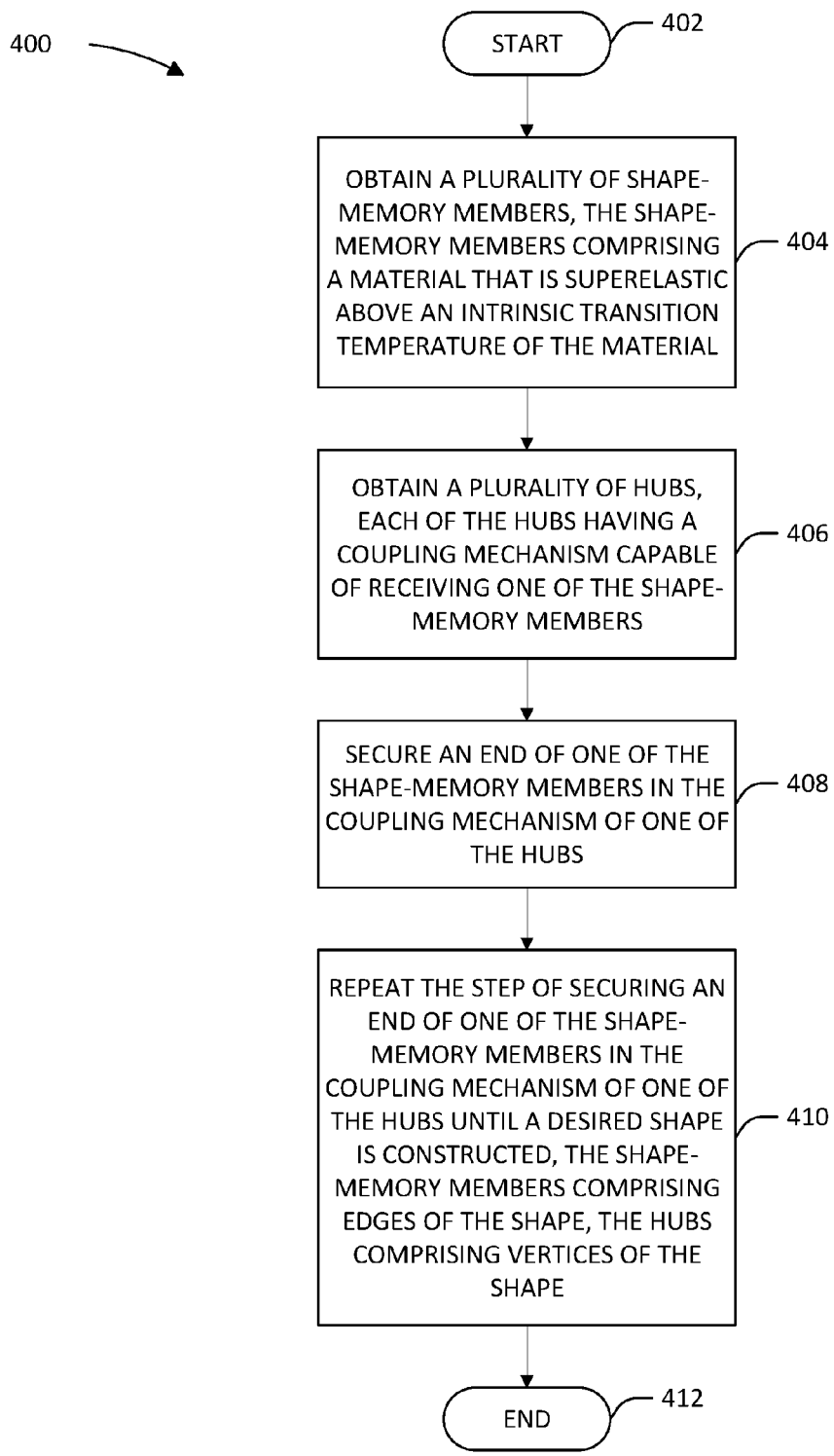
FIG. 4 illustrates an exemplary methodology for constructing a self-erecting structure using shape-memory members.
Figure 5:
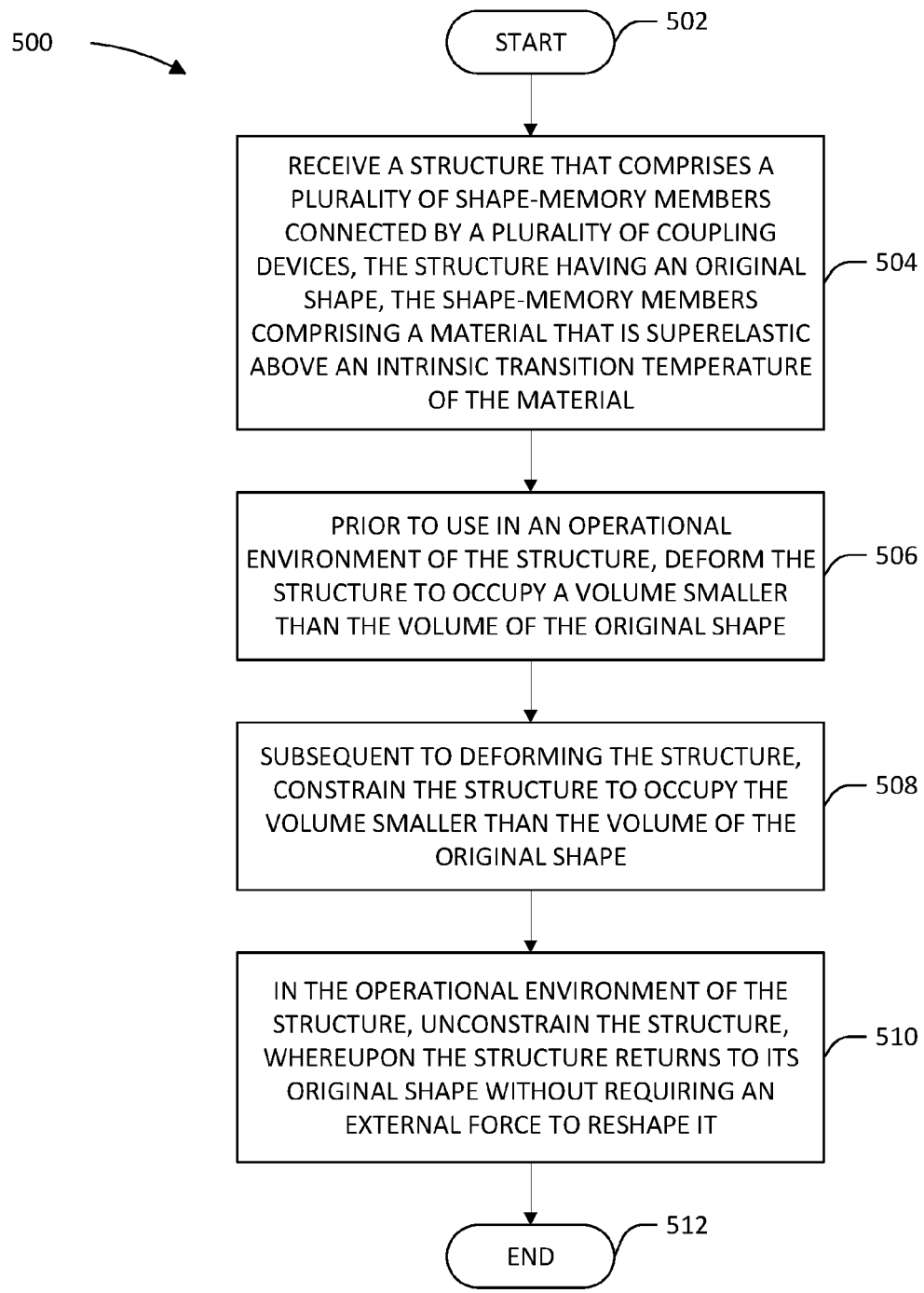
FIG. 5 illustrates an exemplary methodology for using a self-erecting structure.

FIGS. 4-5 illustrate exemplary methodologies relating to constructing and using self-erecting structures. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Referring now to FIG. 4, a methodology 400 that facilitates constructing a self-erecting structure using shape-memory members is illustrated. The methodology 400 begins at 402, and at 404 a plurality of shape-memory members are obtained, wherein the shape-memory members are made of a material that is superelastic, i.e., that returns to its original shape when an external force causing deformation is removed, above a transition temperature that is intrinsic to the material. A plurality of hubs is obtained at 406, where each of the hubs has a coupling mechanism that is capable of receiving one of the shape-memory members. At 408, an end of one of the shape-memory members is secured in one of the coupling mechanism of one of the hubs, where the coupling mechanism can be any means of securing the end of the shape-memory member at a fixed orientation relative to an end of another shape-memory member (e.g., clamps, crimping, sockets, etc.). At 410, the step 408 of securing the end of the shape-memory member in the coupling mechanism of the hub is repeated until a desired shape is constructed, where the shape-memory members are edges of the shape and the hubs are the shape's vertices, whereupon the methodology 400 ends at 412.

FIG. 5 illustrates an exemplary methodology 500. The methodology 500 begins at 502 and at 504 a structure that comprises a plurality of shape-memory members connected by a plurality of coupling devices is received, wherein the structure has an original shape. At 506, prior to using the structure in its operational environment, the structure is deformed to occupy a volume smaller than the volume of the original shape of the structure. At 508, subsequent to the structure being deformed, the structure is constrained to occupy the volume smaller than the volume of the original shape. The structure can be constrained in any way that prevents the structure from returning to its original shape. At 510, the structure is unconstrained in its operational environment, whereupon the structure returns to its original shape without requiring external forces to reshape it, and at 512 the methodology 500 ends.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A corner reflector, comprising:
   a plurality of hubs, each of the hubs having at least one coupling mechanism;
   a plurality of shape-memory members, the shape-memory members comprising a material that is superelastic above an intrinsic transition temperature of the material, each of the members having an end inserted in the at least one coupling mechanism of one of the plurality of hubs, the members and the hubs arranged to form an original shape; and
   flexible conductive weaves, each flexible conductive weave is attached to at least two shape-memory members in the shape-memory members, wherein the flexible conductive weaves form faces of the corner reflector when the corner reflector is in the original shape, the corner reflector configured to reflect electromagnetic waves to sources of the electromagnetic waves when in the original shape, wherein responsive to a compressive force being applied to the corner reflector, the corner reflector deforms from the original shape, wherein further, responsive to the compressive force being removed, the corner reflector returns to the original shape without application of an external force.

2. The corner reflector of claim 1, wherein the hubs are composed of a rigid material.

3. The corner reflector of claim 2, wherein the hubs are composed of a rigid plastic.

4. The corner reflector of claim 1, wherein the shape-memory members comprise a shape-memory alloy.

5. The corner reflector of claim 4, wherein the shape-memory alloy is a nickel-titanium alloy.

6. The corner reflector of claim 1, wherein the original shape is a cube.

7. The corner reflector of claim 1, wherein the original shape is an octahedron.

8. The corner reflector of claim 1, wherein the original shape is an icosahedron.

9. The corner reflector of claim 1, wherein the shape-memory members comprise a shape-memory polymer.

10. The corner reflector of claim 1, wherein the transition temperature of the shape-memory members is below a standard ambient temperature of an operational environment of the corner reflector.

11. A method of constructing a corner reflector, the method comprising:
   obtaining a plurality of shape-memory members, the shape-memory members comprising a material that is superelastic above an intrinsic transition temperature of the material;
   obtaining a plurality of hubs, each of the hubs having a coupling mechanism capable of receiving one of the shape-memory members;
   securing an end of one of the shape-memory members in the coupling mechanism of one of the hubs;
   repeating the step of securing an end of one of the shape-memory members in the coupling mechanism of one of the hubs until a shape of the corner reflector is constructed, the shape-memory members comprising edges of the shape, the hubs comprising vertices of the shape, the shape comprising a plurality of faces; and
   attaching conductive weaves to the plurality of faces, wherein the conductive weaves are configured to reflect electromagnetic waves to sources of the electromagnetic waves when the corner reflector is in the shape.

12. The method of claim 11, wherein the corner reflector is an octahedral corner reflector.

13. The method of claim 11, wherein the shape is a cube.

14. The method of claim 11, wherein the shape is an icosahedron.

15. The method of claim 11, wherein obtaining the plurality of shape-memory members comprises obtaining a plurality of shape-memory members having a transition temperature below a typical temperature of an operational environment of the corner reflector.

16. The method of claim 11, wherein obtaining the plurality of shape-memory members comprises obtaining a plurality of shape-memory members having a transition temperature above a typical temperature of an operational environment of the corner reflector.

17. A method, comprising:
   receiving a corner reflector that comprises a plurality of shape-memory members connected by a plurality of coupling devices, the corner reflector further comprises conductive weaves that are respectively attached to shape-memory members in the plurality of shape-memory members, the corner reflector having an original shape, the conductive weaves form faces of the original shape, the shape-memory members comprising a material that is superelastic above an intrinsic transition temperature of the material;
   prior to use in an operational environment of the corner reflector, deforming the corner reflector to occupy a volume smaller than the volume of the original shape;
   subsequent to deforming the corner reflector, constraining the corner reflector to occupy the volume smaller than the volume of the original shape; and
   in the operational environment of the corner reflector, unconstraining the corner reflector, whereupon the corner reflector returns to its original shape without requiring an external force to reshape it, wherein the corner reflector is configured to reflect electromagnetic waves to sources of the electromagnetic waves when in the original shape.

18. The method of claim 17, wherein an ambient temperature of the operational environment of the corner reflector is below the transition temperature of the shape-memory members, the method further comprising heating the corner reflector to a temperature above the transition temperature prior to unconstraining the corner reflector.

19. The method of claim 17, wherein the shape-memory members are formed of a shape-memory alloy.

20. The method of claim 19, wherein the shape-memory alloy is a nickel-titanium alloy.

* * * * *